United States Patent
Orr et al.

(10) Patent No.: US 7,772,507 B2
(45) Date of Patent: Aug. 10, 2010

(54) SWITCH ASSEMBLY AND ASSOCIATED HANDHELD ELECTRONIC DEVICE

(75) Inventors: Kevin Orr, Elmira (CA); Douglas Edgar Fregin, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 792 days.

(21) Appl. No.: 11/556,460

(22) Filed: Nov. 3, 2006

(65) Prior Publication Data

US 2008/0123267 A1    May 29, 2008

(51) Int. Cl.
*H01H 25/04* (2006.01)
(52) U.S. Cl. .................. 200/5 R; 200/6 A; 341/33; 341/35; 345/161; 345/168
(58) Field of Classification Search .............. 200/4, 200/5 R, 1 B, 600, 406, 516, 339, 6 A, 17 R, 200/18; 341/20, 22, 33, 34, 35; 345/156, 345/157, 161, 168, 169, 173, 184
See application file for complete search history.

(56) References Cited

U.S. PATENT DOCUMENTS

| | | | |
|---|---|---|---|
| 4,566,001 A | | 1/1986 | Moore et al. |
| 5,543,592 A | * | 8/1996 | Gaultier et al. .............. 200/6 A |
| 5,990,431 A | * | 11/1999 | Wright ..................... 200/302.3 |
| 6,115,030 A | | 9/2000 | Berstis et al. |
| 6,243,080 B1 | | 6/2001 | Molne |
| 6,670,563 B1 | * | 12/2003 | Jeon .......................... 200/11 R |
| 6,784,384 B2 | * | 8/2004 | Park et al. .................. 200/11 R |
| 6,919,879 B2 | * | 7/2005 | Griffin et al. ................ 345/168 |
| 7,046,230 B2 | * | 5/2006 | Zadesky et al. ............. 345/156 |
| 7,279,647 B2 | * | 10/2007 | Philipp ...................... 200/5 R |
| 7,348,967 B2 | * | 3/2008 | Zadesky et al. ............. 345/173 |
| 7,435,921 B2 | * | 10/2008 | Rae et al. .................... 200/333 |
| 7,450,108 B2 | * | 11/2008 | Clabunde et al. ............ 345/157 |
| 7,499,025 B2 | * | 3/2009 | Endo et al. .................. 345/157 |
| 2002/0176016 A1 | | 11/2002 | Misawa et al. |
| 2005/0052425 A1 | | 3/2005 | Zadesky et al. |

FOREIGN PATENT DOCUMENTS

EP    1 691 263 A    8/2006
WO    2005/019987 A    3/2005

* cited by examiner

*Primary Examiner*—Michael A Friedhofer
(74) *Attorney, Agent, or Firm*—Mukundan Chakrapani; Borden Ladner Gervais LLP

(57) ABSTRACT

An improved switch assembly for use in a handheld electronic device comprises a capacitive sensing system employing a capacitive slider input device to detect navigational inputs, and further provides a pair of switches mounted to the slider on an underside thereof to provide selection or escape inputs as desired.

15 Claims, 6 Drawing Sheets

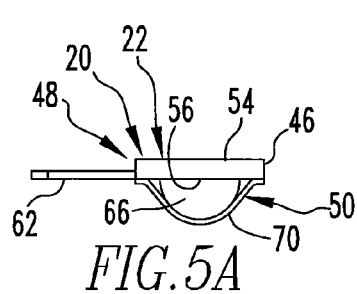
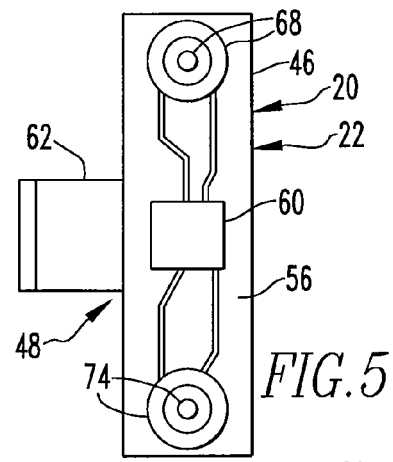
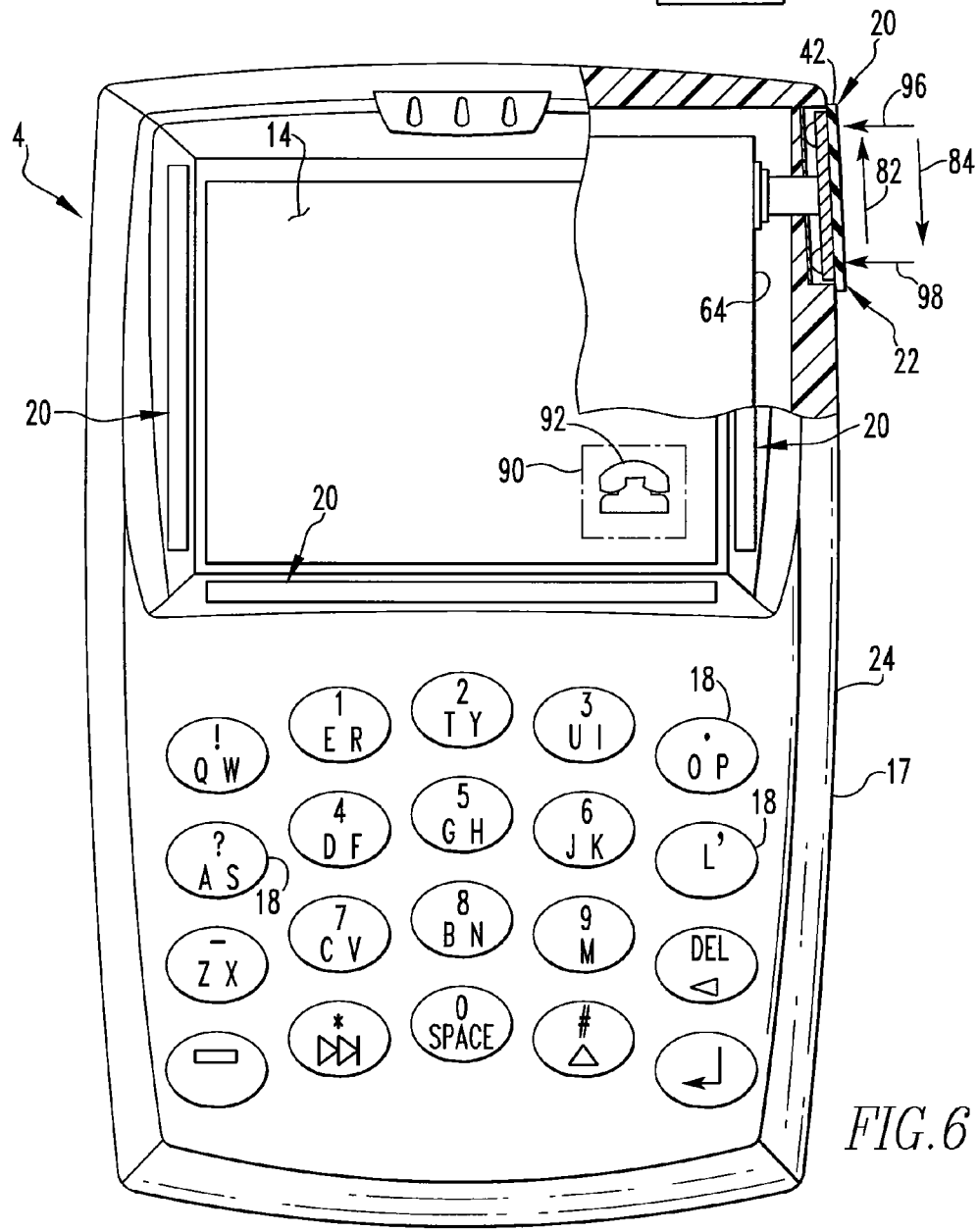
FIG. 5A
FIG. 5
FIG. 6

SWITCH ASSEMBLY AND ASSOCIATED HANDHELD ELECTRONIC DEVICE

BACKGROUND

1. Field

The disclosed and claimed concept relates generally to handheld electronic devices and, more particularly, to a switch assembly for a handheld electronic device, wherein the switch assembly comprises a capacitive slider device.

2. Description of the Related Art

Numerous types of handheld electronic devices are known. Examples of such handheld electronic devices include, for instance, personal data assistants (PDAs), handheld computers, two-way pagers, cellular telephones, and the like. Many handheld electronic devices also feature a wireless communication capability, although many such handheld electronic devices are stand-alone devices that are functional without communication with other devices.

Various types of input devices have been employed on handheld electronic devices. Mechanical input devices such as joysticks, track wheels, trackballs, and the like have had limitations because they can wear out or break, and the location of such mechanical input device typically provides a channel through which dust and other undesired foreign matter can find its way into the interior of the handheld electronic device with deleterious effect. While certain devices have employed capacitive input components in an attempt to overcome some of these issues, the resultant devices have nevertheless had limited capabilities. It is thus desired to provide an improved input device that overcomes certain limitations related to previous solutions. Such an improved input device preferably would be of a modular configuration, thus enabling its use in many different environments.

BRIEF DESCRIPTION OF THE DRAWINGS

A full understanding of the disclosed and claimed concept can be gained from the following Description when read in conjunction with the accompanying drawings in which:

FIG. 5 is a plan view of a surface of a substrate of the switch assembly;

FIG. 5A is an end view of the switch assembly;

FIG. 6 is a view similar to FIG. 1, except partially cut away;

Similar numerals refer to similar parts throughout the specification.

DESCRIPTION

Figure 1:
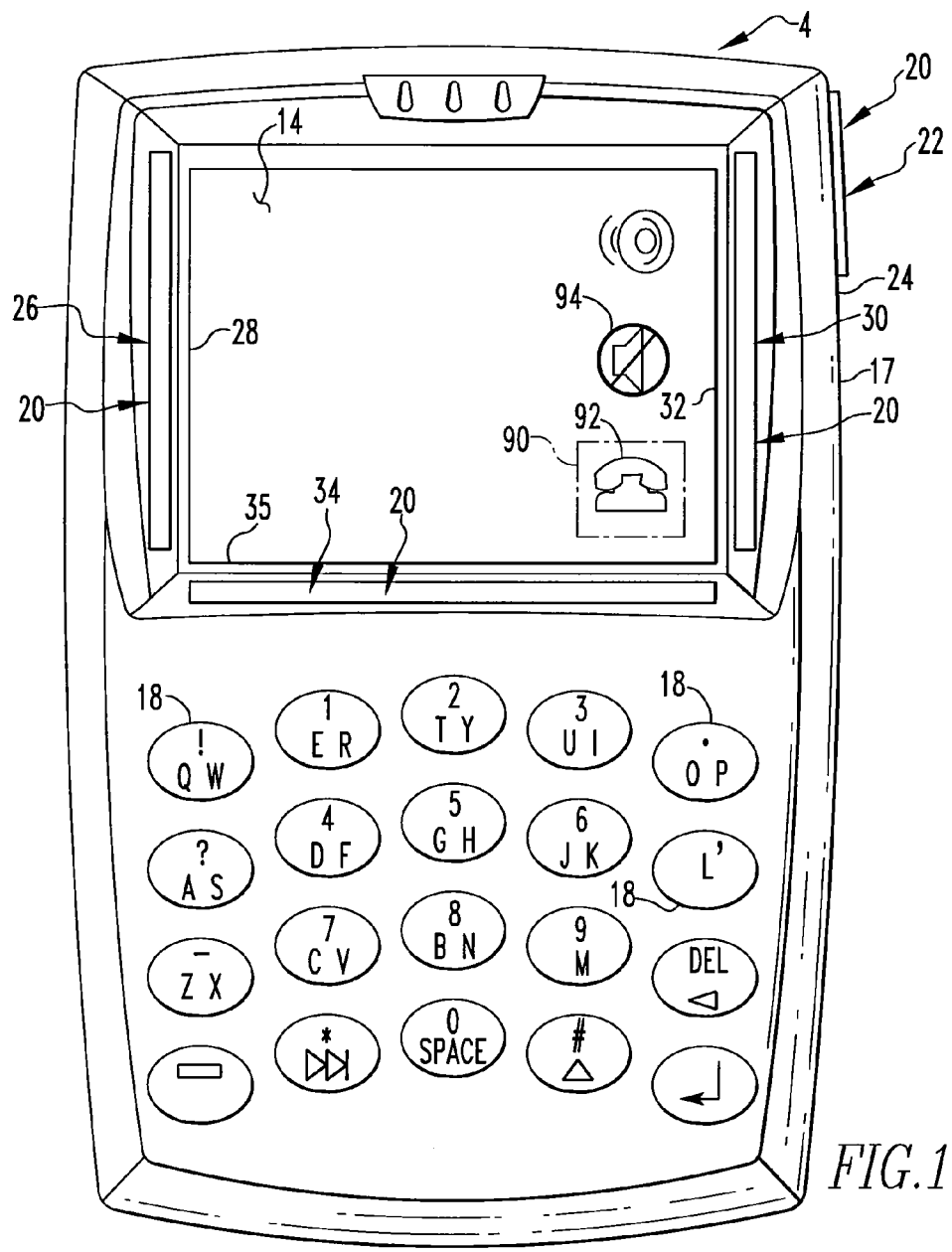
FIG. 1 is a front elevational view of an improved handheld electronic device in accordance with the disclosed and claimed concept that incorporates a number of switch assemblies in accordance with the disclosed and claimed concept and on which can be provided an improved method in accordance with the disclosed and claimed concept.
Figure 2:
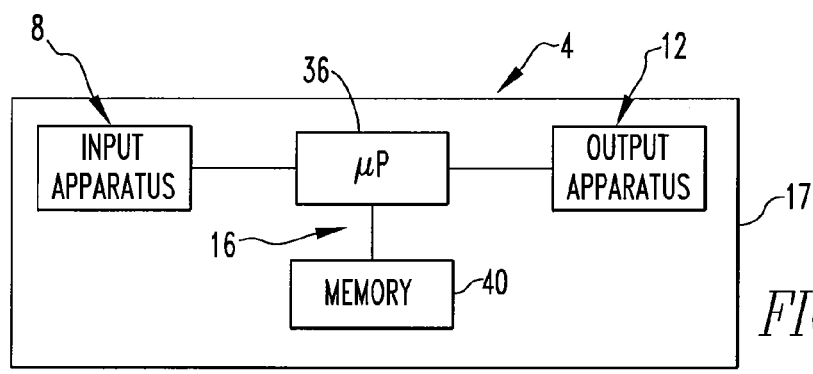
FIG. 2 is a schematic depiction of the handheld electronic device of FIG. 1.

An improved handheld electronic device 4 in accordance with the claimed and disclosed concept is indicated generally in FIG. 1 and is depicted schematically in FIG. 2. The handheld electronic device 4 comprises an input apparatus 8, an output apparatus 12 that comprises a display 14, and a processor apparatus 16, all of which are disposed and supported on a housing 17. The input apparatus 8 provides input signals to the processor apparatus 16 which provides output signals to the output apparatus 12.

The input apparatus 8 comprises a plurality of keys 18 and a plurality of improved switch assemblies 20 in accordance with the disclosed and claimed concept. In the present exemplary embodiment, the various switch assemblies 20 include a side switch assembly 22 disposed on a side 24 of the housing 17, a left switch assembly 26 which is disposed adjacent a left side 28 of the display 14, a right switch assembly 30 which is disposed adjacent a right side 32 of the display 14, and a lower switch assembly 34 which is disposed adjacent a bottom side 35 of the display 14. As can be understood, the left and right sides 28 and 32 of the display 14 are at opposite sides of the display 14, and the bottom side 35 extends generally between the left and right sides 28 and 32 and forms corners therewith.

The processor apparatus 16 comprises a processor 36 and a memory 40. The processor 36 can be any of a wide variety of processors such as a microprocessor (μP) that would be responsive to input from the input apparatus 8 and that would provide output signals to the output apparatus 12. The memory 40 can be any of a wide variety of storage devices such as RAM, ROM, EPROM, EEPROM, FLASH, and the like without limitation, and is generally in the nature of an internal storage area of a computer. The memory 40 has a number of routines stored therein which are executable of the processor 36.

Figure 3:
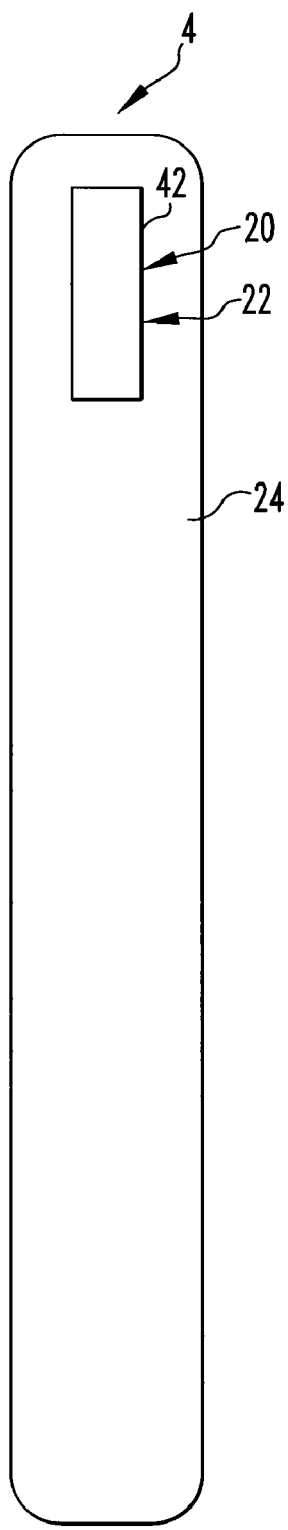
FIG. 3 is a side elevational view of the handheld electronic device of FIG. 1.

As can be understood from FIG. 3, a membrane 42 is disposed on the housing 17. As can be understood from FIG. 4, the membrane 42 seals, i.e., encloses, the side switch assembly 22 within a receptacle 44 formed in the housing 17. The membrane 42 advantageously resists the entry of dust, water, and other contaminants into the interior of the handheld electronic device 4. While in FIG. 3 the membrane 42 is what is primarily visible from the exterior of the housing 17, for the sake of simplicity the presence of the membrane 42 in FIG. 3 is employed herein as an indication that the side switch assembly 22 is disposed underneath the membrane 42. The same can be said of the left switch assembly 26, the right switch assembly 30, and the lower switch assembly 34, all of which are disposed underneath membranes, but wherein the membrane provides an indication of the presence of the appropriate switch assembly 20 underneath.

As can be understood from FIGS. 4, 5, 5A, and 7, each switch assembly comprises a substrate 46, a capacitive sensing system 48, a first switch 50, and a second switch 52. It is noted that the side switch assembly 22 is described herein as being of a particular configuration. It is understood, however, that the left switch assembly 26, the right switch assembly 30, and the lower switch assembly 34 are of the same configuration, yet are of slightly different in dimensions, etc., while providing the same functions. As such, the particular configurations of the left switch assembly 26, the right switch assembly 30, and the lower switch assembly 34 are no further described herein other than with reference to the side switch assembly 22.

The substrate 46 in the present exemplary embodiment is a substantially rigid member having a first surface 54 and a second surface 56 opposite one another. The substrate 46 may be any of a wide variety of materials and is, in the depicted exemplary embodiment, in the form of a small printed circuit board, although other materials may be employed without limitation. In one particular alternate configuration, the substrate 46 could be formed as a flexible circuit sheet. Such a configuration would enable more switches than merely the first and second switches 50 and 52 to be incorporated into the switch assembly 20.

The capacitive sensing system 48 comprises a series of spaced contacts 58 disposed on the first surface 54 and a capacitive controller circuit 60 that is disposed on the second surface 56. The contacts 58 are electrically connected with the capacitive controller circuit 60. The capacitive sensing system 48 additionally comprises a flexible conductor 62 that electrically connects together the capacitive controller circuit 60 and a printed circuit board 64 (FIG. 6) of the handheld electronic device 4. That is, a connector is disposed at a free end of the flexible conductor 62, and such connector is electrically connected with a corresponding connector mounted to the printed circuit board 64.

It is noted that the flexible conductor 62 could be of many configurations. For instance, the flexible conductor could be in the form of a known elastomeric conductor. Alternative, the flexible conductor 62 could employ a spring contact in combination with other structures, whether rigid or flexible.

The capacitive controller circuit 60 and the flexible conductor 62 are schematically depicted in FIG. 5. As such, it is understood that the specific positioning of the capacitive controller circuit 60 and the flexible conductor 62 with respect to the other components of the switch assembly 20 is not intended to be limiting. For instance, the capacitive controller circuit 60 may be disposed at an edge of the substrate 46 or in other positions thereon. Similarly, the flexible conductor 62 can extend from any surface or edge of the substrate, and can be in any of a variety of positions with respect to the capacitive controller circuit 60.

The capacitive controller circuit 60 employs known relaxation oscillator technology to detect a change in capacitance between pairs of the contacts 58 for the purpose of detecting intended input to the processor apparatus 16. The pairs of contacts 58 oftentimes are adjacent pairs of contacts 58, although this need not necessarily be the case, as will be set forth in greater detail below in a particular example. It is noted that such a change in capacitance can result from an actual physical contact with one or more of the contacts 58, such as with the user's finger, or can result from the mere proximity of the user's finger, for example, with one or more of the contacts 58, as is understood in the relevant art.

The first switch 50 is mounted to the substrate 46 and is disposed on the second surface 56. The same can be said of the second switch 52. The first switch 50 comprises a first dome 66, a first set of conductors 68, and a first retention member 70. The second switch 52 can be said to comprise a second dome 72, a second set of conductors 74, and a second retention member (which is not expressly depicted herein for purposes of clarity, but which is substantially similar to the first retention member 70). The first and second domes 66 and 72 are movable between a free state, i.e., a non-collapsed state, such as is depicted generally in FIG. 6, and a collapsed state, such as is depicted alternately in FIGS. 7 and 8. In the non-collapsed state, the first and second switches 50 and 52 are in a non-actuated position, and the first and second domes 66 and 72 leave open circuits that otherwise would comprise the first set of conductors 68 and the second set of conductors 74, respectively. However, when the first dome 66 is in the collapsed position, such as is depicted generally in FIG. 7, it closes a circuit that includes the first set of conductors 68. The closing of such a circuit can provide a selection input or other input to the processor apparatus 16. When the first dome 66 is in the collapsed position, the first switch 50 is in the actuated position.

Figure 8:
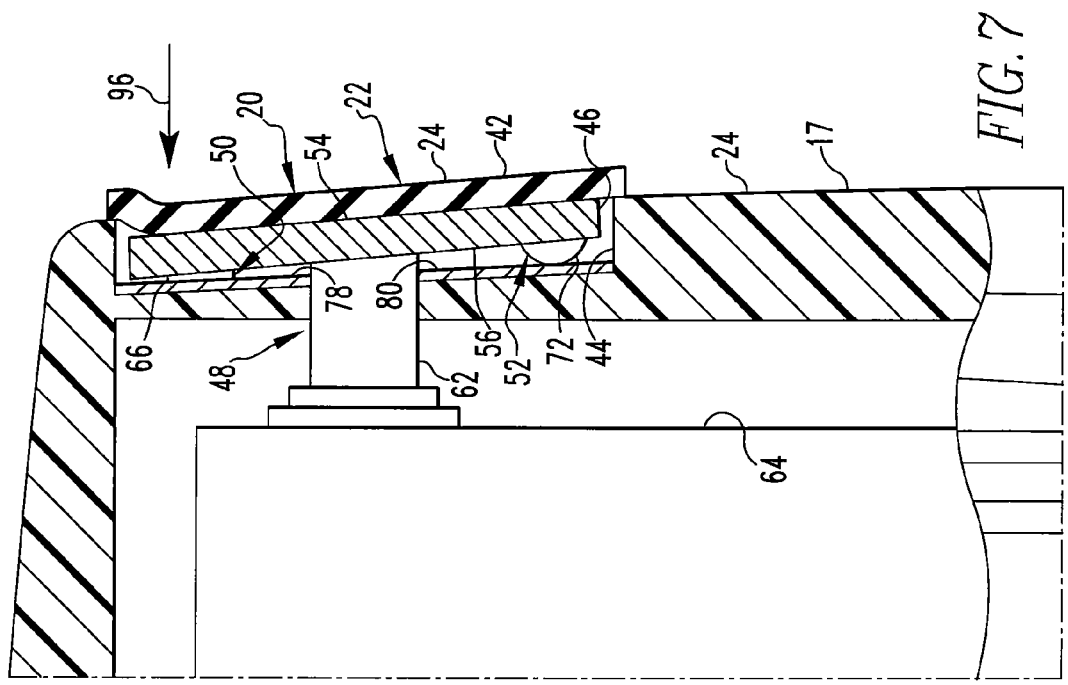
FIG. 8 is a view similar to FIG. 7, except depicting a different switch in an actuated position.

Similarly, when the second dome 72 is in the collapsed position, such as is depicted generally in FIG. 8, it closes a circuit that includes the second set of conductors 74. The closing of such a circuit can provide an escape input, i.e., a "back" input, or other input to the processor apparatus 16. When the second dome 72 is in the collapsed position, the second 52 switch is in the actuated position. The first and second domes 66 and 72 also advantageously provide tactile feedback to a user when the user manually moves the first and/or second domes 66 and 72 between the non-collapsed and collapsed positions. Other feedback or no feedback may be provided, however, within the scope of the present concept.

The first and second sets of conductors 68 and 74 are ordinary electrical conductors disposed on the second surface 56 of the substrate 46. The first retention member 70 adheringly retains the first dome 66 disposed on the second surface 56. Specifically, the first retention member 70 is in the exemplary form of a sheet of Mylar® having an adhesive applied to certain regions of a first surface thereof. The first surface of the first retention member 70 is engaged with a proud portion of the first dome 66. Peripheral regions of the first retention member 70 are adhered to the second surface 56 of the substrate 46. The same can be said of the way in which the second retention member retains the second dome 72 disposed on the second surface 56 of the substrate 46. It thus can be seen that the substrate 46, the capacitive sensing system 48, the first switch 50, and the second switch 52 together form a modular unit that can be incorporated into the handheld electronic device 4 and can be employed in numerous other capacities.

Figure 7:
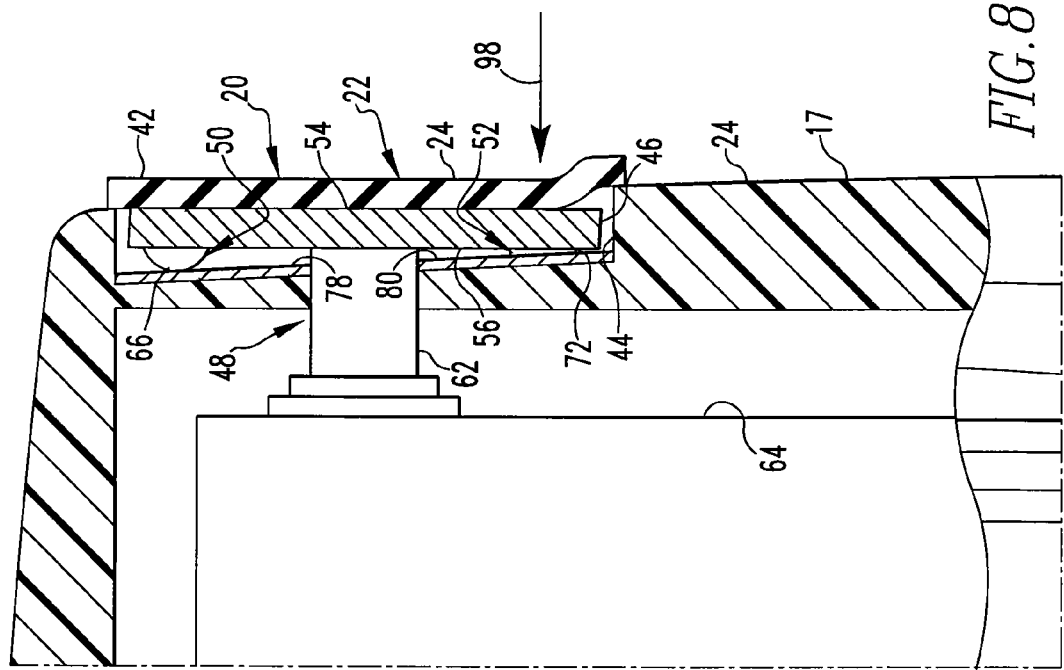
FIG. 7 is an enlarged view similar to a portion of FIG. 6, except depicting a switch of the switch assembly in an actuated position.

As can be understood from FIG. 7, the housing 17 comprises an engagement wall 78 having an engagement surface 80 adjacent the receptacle 44. The first and second domes 66 and 72, specifically the proud portions thereof, are engageable with the engagement surface 80 to move the first and second domes 66 and 72 from the non-collapsed position to the collapsed position. In the exemplary embodiment depicted herein, the proud portions of the first and second domes 66 and 72 are at all times engaged with the engagement surface 80, but this need not always be the case in other embodiments.

In accordance with the disclosed and claimed concept, the capacitive sensing system 48 is configured to detect sliding motions by a user, such as with the user's finger, with respect to the series of contacts 58, and to interpret such movements as navigational inputs to the processor apparatus 16. A routine in the form of a graphical user interface (GUI) employs such navigational inputs from the capacitive sensing system 48 to, for instance, move a visual focus 90 among various locations about the display 14.

For instance, a sliding motion in a first sliding direction 82 along at least some of the contacts 58 of the series can be detected by the capacitive sensing system 48 and converted into a navigational input in an upward direction from the perspective of FIG. 6. Such a navigational input could, for instance, move the visual focus 90 in an upward direction from one icon 92, such as depicted generally in FIG. 1, to an adjacent icon 94, such as is similarly depicted in FIG. 1. A sliding motion in a second sliding direction 84 could be interpreted as a navigational input in a downward direction and can result in a downwardly directed movement of the visual focus 90.

Figure 4:
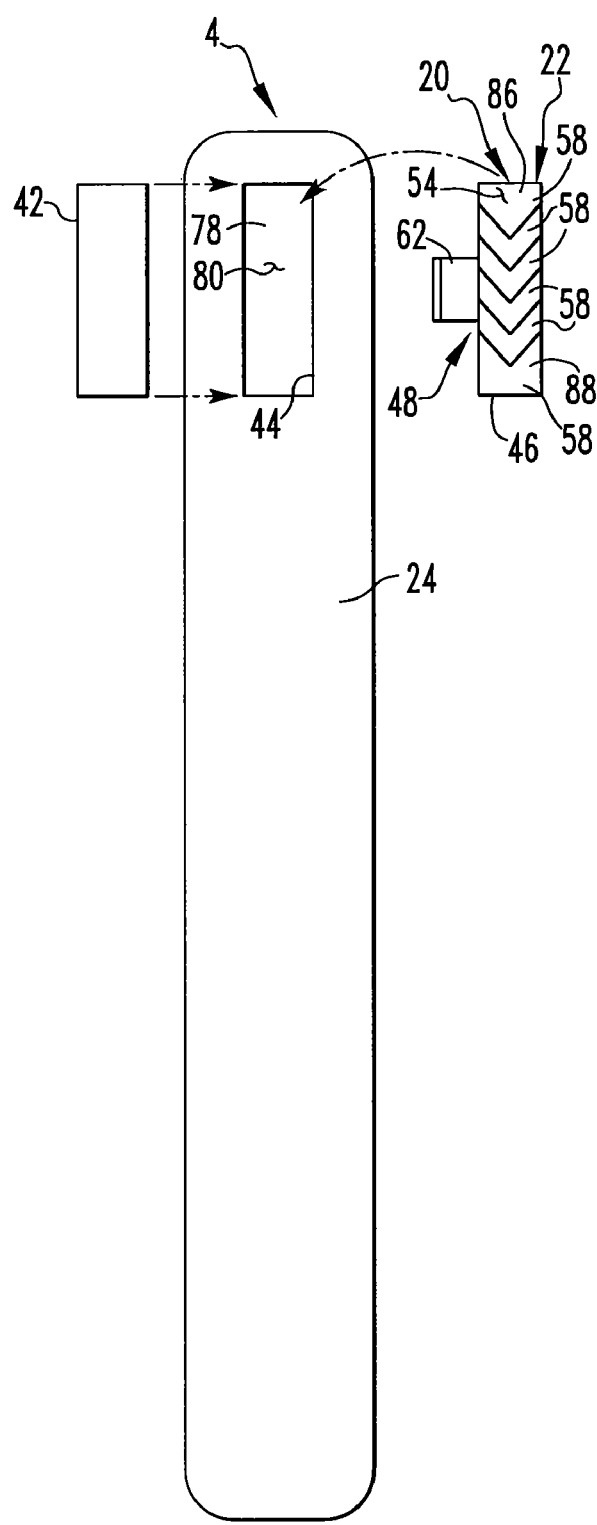
FIG. 4 is an exploded version of FIG. 3.

As can be further understood from FIG. 4, the series of contacts 58 include a first end contact 86 and a second end contact 88, along with a number of intermediate contacts 58. It can be understood from FIGS. 4 and 6-8 that the end contact 86 is disposed on the first surface 54 at a location opposite another location on the second surface 56 where the first switch 50 is disposed. Similarly, the second end contact 88 is disposed at a location on the first surface 54 that is opposite another location on the second surface 56 where the second switch 52 is disposed.

The switch assemblies 20 advantageously, therefore, employ a detection of a sliding motion in the first and second directions 84 to provide navigational input to the processor apparatus 16. Furthermore, when the user has reached either end of the substrate 46 after such a sliding motion, the user can translate the substrate 46 toward the engagement surface 82 actuate either the first switch 50 or the second switch 52 to provide a selection input, an escape input, or other input to the processor apparatus 16. That is, a translation actuation of the side switch assembly 22 as indicated in the actuation direction 96 in FIG. 7 results in a translation of the substrate 46 toward the engagement surface 80 to engage the proud portion of the first dome 66 with the engagement surface 80 and to thereby collapse the dome 66. This causes a corresponding closing of a circuit that comprises the first set of conductors 68, and ultimately results in a selection input or other input being provided to the processor apparatus 16.

Similarly, a translation actuation of the side switch assembly 22 in the actuation direction 98 in FIG. 8 results in a translation of the substrate 46 toward the engagement surface 80 to engage the proud portion of the second dome 72 with the engagement surface 80 and to thereby collapse the second dome 72. This closes a circuit that includes the second set of conductors 74 and results in an escape input or other input being provided to the processor apparatus 16.

Since the substrate 46 is substantially rigid, such a translation of the substrate 46 toward the engagement wall 78 in either the actuation direction 96 or the actuation direction 98 will, in addition to the translation of the substrate 46, result in at least a slight of pivoting of the substrate 46. Such combined translation and rotation is a result of the substrate 46 largely being free-floating within the receptacle 44, albeit being interposed between the engagement wall 78 and the membrane 42. It is noted, however, that the expression "translation" and variations thereof herein is not intended to exclude any such additional pivoting or rotation, and rather is intended to comprise such additional pivoting or rotation or other movement, with the result that the expression "translation" and variations thereof can refer to a complex motion without departing from the present concept.

It is understood that a fulcrum or other type of structure or device, not expressly depicted herein, can be employed within the receptacle 44 to engage the substrate 46 at roughly its midpoint, for instance, to resist the first and second switches 50 and 52 from being simultaneously actuated, should this be desired. In this regard, it is understood that the handheld electronic device 4 may be configured such that in certain circumstances the first and second switches 50 and 52 provide different functions. Such different functions may be of a type that should never occur simultaneously, in which case the fulcrum might desirably be provided to resist simultaneous actuation of the first and second switches 50 and 52. On the other hand, such different functions might in some circumstances be complementary and might desirably occur simultaneously, in which case a fulcrum might not be desired.

By providing the first switch 50 opposite the first end contact 86, and by providing the second switch 52 opposite the second end contact 88, the user can rapidly employ sliding motions and translation-actuation motions to provide navigational inputs and selection, escape, and other inputs to the processor apparatus 16. In this regard, it noted that it is advantageously unnecessary to move a user's finger beyond the contacts 58 of a capacitive system in order to provide a distinct type of input, such as selection, escape, or other input, since the first and second domes 66 and 72 (and thus the first and second switches 50 and 52) are disposed directly opposite the first and second end contacts 86 and 88. It is further noted, however, that in other embodiments the capacitive controller circuit 60 could be configured to ignore inputs received respective of the end contacts 86 and 88.

In actuating the first and second switches 50 and 52, it is understood that the actuation directions 96 and 98 are nonparallel with an axis (not expressly depicted herein) oriented normal to the plane of the printed circuit board 64 of the handheld electronic device 4, i.e., an axis normal to the plane of the page of FIGS. 1 and 6. It is noted, however, that actuations in the actuation directions 96 and 98 apply forces to the engagement wall 78 which, in the exemplary depicted embodiment, is a portion of the housing. That is, a structure of the housing 17 is employed as a reaction structure against which the first and second switches 50 and 52 are actuated (rather than employing a portion of the printed circuit board 64 or a component mounted thereon as the reaction structure). This advantageously reduces wear and tear on the printed circuit board 64 that might otherwise occur if forces required to actuate the first and second switches 50 and 52 were applied directly to the printed circuit board 64. In this regard, it is reiterated that the side switch assembly 22 is connected with the printed circuit board 64 via the flexible conductor 62, and thus translations of the substrate 46 and actuations of the first and second switches 50 and 52 result in virtually no mechanical loading of the printed circuit board 64, and at most result in flexing of the flexible conductor 62.

This is particularly advantageous for a number of reasons. Since the actuation directions 96 and 98 are nonparallel with an axis normal to the plane of the printed circuit board 64, efforts to employ the printed circuit board 64 in actuating the first and second switches 50 and 52 likely would require some type of reaction structure to be mounted on the printed circuit board 64, typically by soldering. Mechanical loading of such a reaction structure necessarily would result in loading of a solder joint between the structure and the printed circuit board 64 an eventual failure of the solder joint. Since the present configuration avoids the mechanical loading of solder joints on a printed circuit board that might otherwise result from actuation of the first and second switches 50 and 52, the useful life of the handheld electronic device 4 can be extended by obviating the potential for premature failure of the printed circuit board 64 and components thereon.

It is also noted that the capacitive sensing system 48 is configured to generally detect sliding movements by the user. That is, the capacitive sensing system 48 is configured to ignore most inputs that result from the user merely approaching the series of contacts 58 without a corresponding sliding motion. Such a configuration can be accomplished by programming the capacitive controller circuit 60 to identify successive changes in capacitances of successive pairs of the contacts 58, and to interpret such a series of capacitance changes as a navigational input to the processor apparatus 16.

It is noted, however, that the capacitive controller circuit 60 can be configured such that "tapping" inputs in certain zones of the series of contacts 58 are recognized as inputs. As employed herein, it is understood that the expression "tapping" and variations thereof in the context of an interaction with the capacitive sensing system 48 need not require in an actual physical contact with the contacts 58 or with the membrane 42, it being further understood that merely approaching the switch assemblies 20 without touching can alter the capacitance between a pair of adjacent contacts 58 sufficiently to enable the event to be detected and interpreted as an input.

It is further understood that such a "tapping" contact can be advantageously combined with a navigational input to provide a different type of input. For instance, if a navigational input in the first or second sliding directions 82 and 84 is accompanied by a tapping input at the terminal end of such sliding motion, such as at one of the end contacts 86 or 88, the combination of the navigational and tapping inputs can be interpreted by the processor apparatus 16 as a page-up or page-down input to be executed by the GUI. This can be accomplished even in the absence of collapsing the domes 66 or 72 to actuate the first and second switches 50 and 52 since the capacitive sensing system 48 would be pre-programmed to detect such a "tapping" input after a navigational input as being an intended input that should not be ignored.

Figure 9:
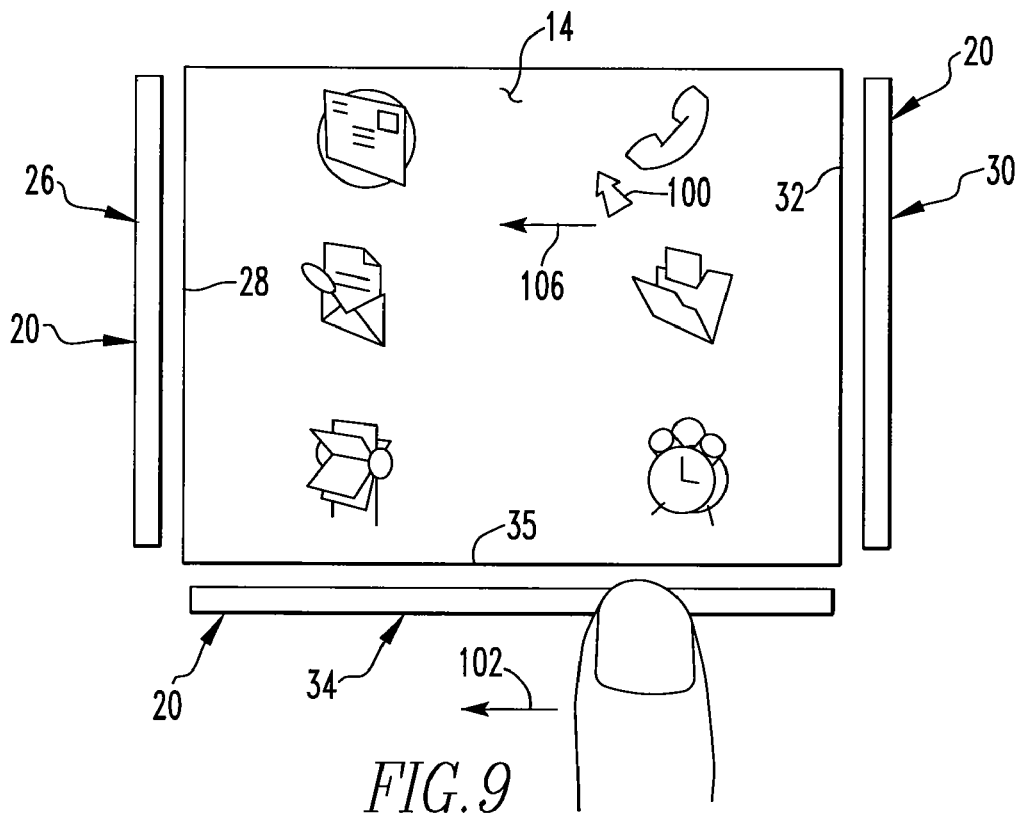
FIG. 9 is a depiction of a one navigational input on the handheld electronic device.
Figure 10:
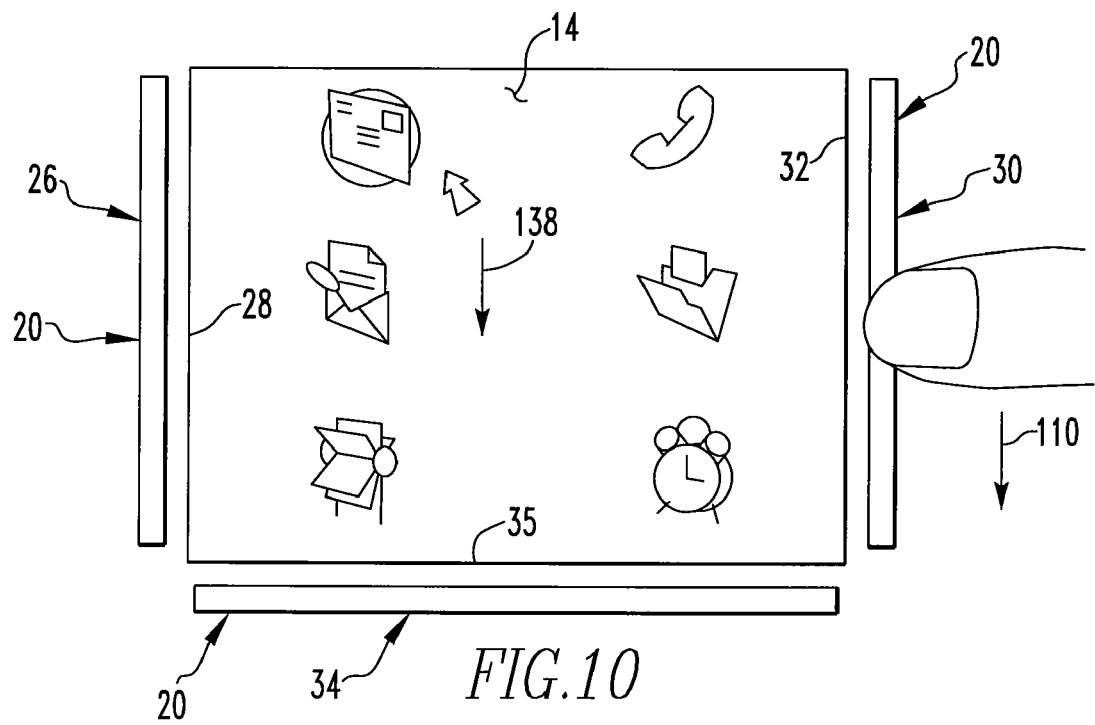
FIG. 10 is a depiction of another navigational input on the handheld electronic device.

An example of a series of navigational inputs is indicated generally in FIGS. 9 and 10. Such navigational inputs move the pointer 100 in Cartesian directions in accordance with sliding movements on the left or right switch assemblies 26 and 30 and on the bottom switch assembly 34. It is noted that the left and right switch assemblies 26 and 30 are provided at opposite sides of the display 14 in order to enable users to provide a navigational input in the north-south direction on the handheld electronic device 4 from either the left hand or the right hand. That is, a navigational input on either the left switch assembly 26 or the right switch assembly 30 will provide a navigational input in the indicated north-south direction.

It is noted that the placement of the left switch assembly 26, the right switch assembly 30, and the lower switch assembly 34 adjacent various sides of the display is particularly advantageous from the standpoint of utilizing available space since it enables navigational inputs in all directions to be achieved using a set of extremely thin switch assemblies 20 disposed in spaces that often may be wasted on handheld electronic device. As is generally understood, the use of a touch pad such as is typically found on a laptop computer is difficult to successfully implement into a handheld electronic device such as depicted herein since such a touch pad often requires a relatively large space for operation. Moreover, the competing considerations of small size, sensitivity, and accuracy militate that a conventional touch screen on a handheld electronic device is impractical since a user's finger typically can simultaneously cover many of the contacts. However, providing the switch assemblies 20 at various locations about the periphery of the display 14 utilizes space that typically might have been wasted with the use of trim components and the like and allows the inputting of navigational inputs in Cartesian directions which can be resolved into navigational inputs in essentially any combined direction.

This is at least in part due to the switch assemblies 20 each being used to resolve movement only along a single axis. Instead of providing a single multi-axis input device, such a touch pad from a conventional laptop computer, the switch assemblies 20 that are provided in various orientations on the handheld electronic device 4 enable a plurality single axis inputs that can be resolved, i.e., combined, to enable navigation input to any location on the display 14.

For instance, and is depicted generally in FIG. 9, a sliding movement in a first direction 102 along the lower switch assembly 34 is detected as a navigational input in the first direction 102 and results in a first movement of the pointer 100 in the direction indicated at the arrow 106. Such a movement of the pointer 100 by the GUI could be considered to be an X-axis Cartesian movement. As can be seen from FIG. 10, a second sliding motion in a second direction 110 along the right switch assembly 30 is interpreted as a navigational input in the second direction 110 and results in a second movement 138 of the pointer 100 by the GUI. Such a movement of the pointer 100 could be considered to be a Y-axis Cartesian movement.

The combined movements of the pointer 100 in the X-axis and Y-axis directions are combinable to allow the pointer 100 to be moved essentially anywhere on the display 14. Also advantageously, since each of the switch assemblies 20, i.e., the left switch assembly 26, the right switch assembly 30, and the lower switch assembly 34, each have a pair of switches disposed at the opposite ends thereof on a surface of a substrate opposite the contacts of a capacitive sensing system thereof, a selection input could be made from any of the switch assemblies 20 and could be interpreted by the processor apparatus 16 as an input such a mouse click. That is, a user could first make an X-axis navigational input in either direction followed by a Y-axis input in either direction, and the user could thereafter apply a switch-actuating force at an end of whichever switch assembly 20 was employed to make the final navigational input to provide a selection input that would be similar to a mouse click input. Since all of the switch assemblies 20 have the first and second switches 50 and 52 and thus could be configured to provide a mouse click type of input at either end of the switch assembly 20, such a mouse click input can be provided by the user by actuating whichever end of whichever switch assembly 20 is closest to the user's finger once sufficient navigational inputs have been provided to position the pointer 100 such that the visual focus 90 is on a desired visual object, and can result in operation of the routine or data item represented by the visual object.

It is noted that the translational speed of a sliding input by a user can be converted by the GUI into a navigational movement of the pointer 100 at a corresponding velocity. That is, a faster sliding input by a user along the series of contact 58 will result in a faster translation of the pointer 100 by the GUI. It is noted that a tapping input in combination with a navigational input can be interpreted as a desirable page-up or page-down input, as mentioned above. It if further noted, however, that a tapping input in combination with a navigational input could instead be interpreted as a request to continue a scrolling input at the same speed as the navigational input. Such an interpretation could result from, for instance, a user-specified configuration of the capacitive controller circuit 60.

As mentioned above, if a touch pad such as from a laptop computer were incorporated into a handheld electronic device, such a touch pad typically would be difficult to operate due to the competing considerations of accuracy, sensitivity, and usability since a finger may cover many of the contacts of such a pad. By providing the various switch assemblies 20, each of which resolve motion only along a single axis, the competing considerations of accuracy and the like associated with conventional touch pads from laptop computers are advantageously overcome.

Figure 11:
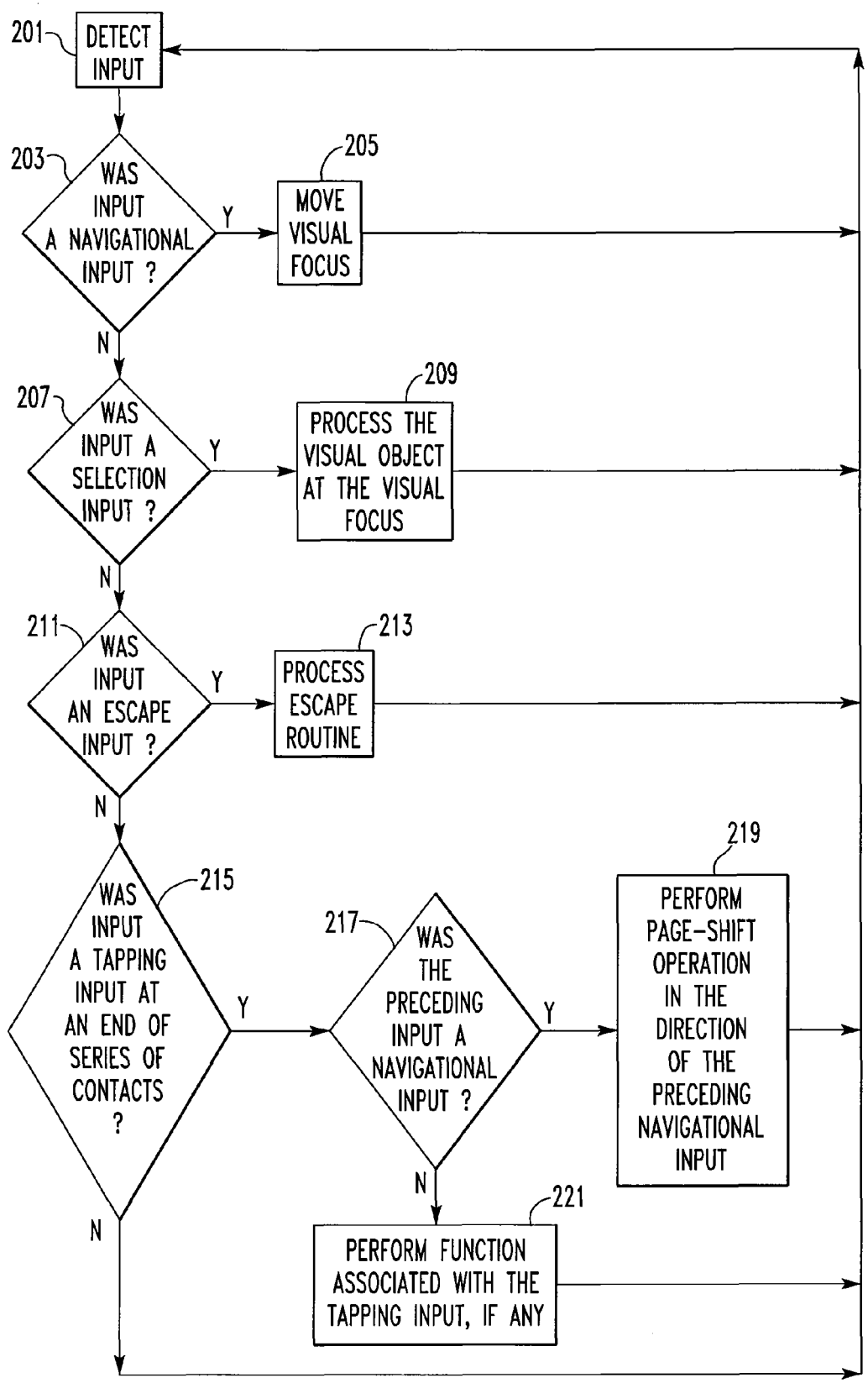
FIG. 11 is a flowchart depicting an improved method in accordance with the disclosed and claimed concept.

An improved method in accordance with the disclosed and claimed concept is depicted generally in FIG. 11. Processing starts at, for instance, 201, wherein an input is detected by the processor apparatus 16. It is then determined, as at 203, whether or not the input was a navigational input. Such a navigational input would, as indicated above, result from a sliding input along one of the switch assemblies 20 as identified by and processed by the capacitive controller circuit 60. If it is determined at 203 that the input was a navigational input, process continues to 205 where the GUI moves the visual focus in a direction corresponding with the navigational input.

If it is determined at 203 that the input was not a navigational input, processing continues to 207 where it is determined whether or not the input was a selection input. Such a selection input would result, for example, from a translation of the substrate 46 in the actuation direction 96 in such a fashion as would actuate the first switch 50. In the event that it is determined at 207 that the input was a selection input, processing continues to 209 where the GUI initiates the processing of the visual object disposed on the display 14 at the current location of the visual focus 90.

On the other hand, if it is determined at 207 that the input was not a selection input, processing continues to 211 where it is determined whether or not the input was an escape input. Such an escape input would result, for example, from a translation of the substrate 46 in the actuation direction 98 in such a fashion as would actuate the second switch 52. In the event that it is determined at 211 that the input was an escape input, processing continues to 213 where an escape routine is initiated.

If it is determined at 211, however, that the input was not an escape input, it is then determined at 215 whether or not the input was a tapping input at an end of the series of contacts 58. As has been indicated above, a tapping input does not actually require physical contact with a switch assembly 20 or a membrane 42, and rather can result merely from proximity of, for instance, a user's finger. In the instance of the processing at 215, at least a portion of the inquiry is directed toward whether or not such a tapping input occurred at either the first end contact 86 or the second end contact 88. If such a tapping input is identified at 215, processing continues to 217 where it is determined whether or not the preceding input was a navigational input. If it is determined at 217 that the preceding input was a navigational input, processing continues at 219 where the GUI performs a page-shift operation in the direction of such a preceding navigational input. If it is determined at 217, however, that the preceding input was not a navigational input, the processor apparatus 16, at 221, performs the function, if any, that was associated with the particular tapping input.

In this regard, it may additionally be determined whether or not the input was a tapping input at a location other than at one of the end contacts 86 and 88. In such a situation, the function, if any, associated with such a tapping input could be initiated, if the handheld electronic device 4 is so configured.

If it is determined at 215 that the input was not a tapping input at and end of the series of contacts 58, the input may be ignored. Processing may thereafter return to 201 where another input may be detected.

While the switch assemblies 20 are described herein as employing a capacitive slider that includes a series of contacts 58 and a capacitive controller circuit 60, it is understood that other types of devices, such as non-capacitive devices, could be employed to detect navigational inputs without departing from the scope of the present concept. It is further noted that the first and second switches 50 and 52 could be of other configurations, i.e., configurations without domes, without departing from the present concept. In this regard, such alternate switches desirably would provide tactile feedback when actuated, although this need not necessarily be the case if tactile feedback is unnecessary, is undesirable, or can be provided in other fashions (or is not provided in favor of other types of feedback).

While specific embodiments of the disclosed and claimed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed and claimed concept which is to be given the full breadth of the claims appended and any and all equivalents thereof.

What is claimed is:

1. A handheld electronic device comprising:
a housing;
a processor apparatus comprising a processor and a memory supported on the housing;
an input apparatus in communication with the processor apparatus and comprising a switch assembly supported on the housing;
an output apparatus in communication with the processor apparatus and comprising a display supported on the housing;
the switch assembly comprising a substrate, a capacitive sensing system, and at least a first switch;
the substrate having a first surface and a second surface opposite one another;
the capacitive sensing system comprising a series of at least three contacts disposed on the first surface; and
the at least first switch being disposed on the second surface and being engageable with an engagement structure to provide an input to the processor apparatus,
wherein the housing has a receptacle formed therein, at least a portion of the switch assembly being disposed in the receptacle, and wherein the housing further comprises a membrane that extends across at least a portion of the receptacle and that substantially encloses the at least portion of the switch assembly within the receptacle.

2. The handheld electronic device of claim 1 wherein the engagement structure has an engagement surface disposed within the receptacle, the switch assembly being engageable with the engagement surface to actuate the at least first switch.

3. The handheld electronic device of claim 1 wherein the processor apparatus comprises a circuit board extending generally in a plane, the processor and the memory being disposed on the circuit board, and wherein the switch assembly is movable between a first position and a second position to move the at least first switch between an unactuated position and an actuated position, the switch assembly being movable between the first and second positions in a direction of movement that is nonparallel with an axis normal to the plane.

4. The handheld electronic device assembly of claim 3 wherein the capacitive sensing system further comprises a flexible conductor and a capacitive controller circuit, the series of contacts being electrically connected with the capacitive controller circuit, the flexible conductor electrically extending between the capacitive controller circuit and the circuit board.

5. The handheld electronic device assembly of claim 3 wherein the at least first switch is a pair of switches that each comprise a collapsible dome having a proud portion that is structured to engage an engagement surface of the engagement structure.

6. The handheld electronic device of claim 1 wherein the switch assembly is disposed adjacent a side of the display, the processor apparatus being structured to interpret certain inputs from the series of contacts as navigational inputs and to interpret an input resulting from an actuation of the at least first switch as at least one of a selection input and an escape input.

7. The handheld electronic device of claim 1 wherein the at least first switch is disposed at a location on the second surface opposite a location on the first surface where at least a first contact of the series is disposed.

8. The handheld electronic device of claim 1 wherein the at least first switch comprises a first switch and a second switch, the first switch being disposed at a location on the second surface opposite a location on the first surface where a contact at a first end of the series is disposed, and the second switch being disposed at a location on the second surface opposite a location on the first surface where a contact at a second end of the series is disposed.

9. The handheld electronic device of claim 1 wherein the at least first switch comprises a collapsible dome and a retention member extending between the dome and the substrate.

10. The handheld electronic device of claim 1, wherein the substrate generally elongate in shape having a first end, a second end opposite the first end, a first surface and a second surface opposite the first surface.

11. A handheld electronic device comprising:
a housing;
a processor apparatus comprising a processor and a memory supported on the housing;
an input apparatus in communication with the processor apparatus and comprising a switch assembly supported on the housing;
an output apparatus in communication with the processor apparatus and comprising a display supported on the housing;
the switch assembly comprising a substrate, a capacitive sensing system, and at least a first switch;
the substrate having a first surface and a second surface opposite one another;
the capacitive sensing system comprising a series of at least three contacts disposed on the first surface; and
the at least first switch being disposed on the second surface and being engageable with an engagement structure to provide an input to the processor apparatus,
wherein the switch assembly is disposed adjacent a side of the display, the processor apparatus being structured to interpret certain inputs from the series of contacts as navigational inputs and to interpret an input resulting from an actuation of the at least first switch as at least one of a selection input and an escape input, and wherein the input apparatus comprises a pair of additional switch assemblies disposed adjacent a pair of opposite sides of the display, the side extending between the pair of opposite sides, the processor apparatus being structured to interpret certain inputs from the series of contacts of the at least first switch assembly as navigational inputs along a first navigational direction on the display and to interpret certain inputs from a series of contacts of either of the pair of additional switch assemblies as navigational inputs along a second navigational direction on the display.

12. The handheld electronic device of claim 1, wherein the switch assembly is disposed on a first side of the housing.

13. The handheld electronic device of claim 12, wherein the display is support by the housing on a second side of the housing.

14. A handheld electronic device comprising:
a housing;
a processor apparatus comprising a processor and a memory supported on the housing;
an input apparatus in communication with the processor apparatus and comprising a switch assembly supported on the housing;
an output apparatus in communication with the processor apparatus and comprising a display supported on the housing;
the switch assembly comprising a substrate, a capacitive sensing system, and at least a first switch;
the substrate having a first surface and a second surface opposite one another;
the capacitive sensing system comprising a series of at least three contacts disposed on the first surface; and
the at least first switch being disposed on the second surface and being engageable with an engagement structure to provide an input to the processor apparatus,
wherein the switch assembly is disposed adjacent a side of the display, the processor apparatus being structured to interpret certain inputs from the series of contacts as navigational inputs and to interpret an input resulting from an actuation of the at least first switch as at least one of a selection input and an escape input, and wherein the input apparatus comprises another switch assembly disposed adjacent another side of the display, the side and the another side intersecting at a corner of the display, the processor apparatus being structured to interpret certain inputs from the series of contacts of the at least first switch assembly as navigational inputs along a first navigational direction on the display and to interpret certain inputs from a series of contacts of the another switch assembly as navigational inputs along a second navigational direction on the display.

15. The handheld electronic device of claim 11, wherein the series of at least three contacts are disposed on the first surface of the substrate, and the at least three contacts are disposed in a linear arrangement between the first end and the opposite second end.

* * * * *